March 26, 1968 A. W. WEINRICH 3,375,467
LOW NOISE VHF TRANSISTOR OSCILLATOR
Filed May 27, 1966
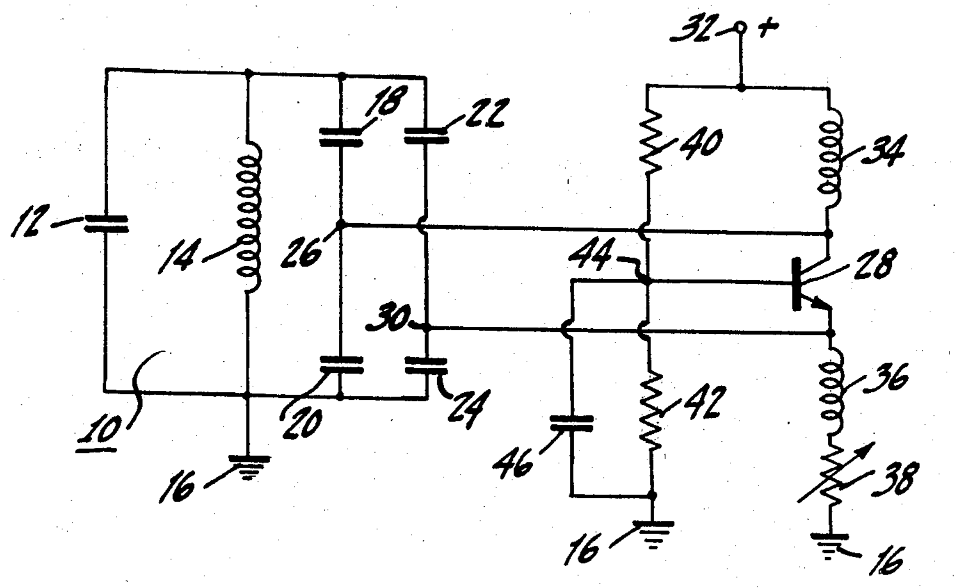
INVENTOR.
ALBERT W. WEINRICH
BY
Simon Yaffee
Attorney 3,375,467

LOW NOISE VHF TRANSISTOR OSCILLATOR

Albert W. Weinrich, Collingswood, N.J., assignor to Radio Corporation of America, a corporation of Delaware Filed May 27, 1966, Ser. No. 553,499
10 Claims. (Cl. 331—117)

ABSTRACT OF THE DISCLOSURE

A low noise oscillator includes a tank circuit with the emitter and collector of a transistor coupled in feedback relation to the tank circuit. A large capacitor is effectively connected between the collector and base of the transistor to swamp out variations in the output capacity of the transistor. The coupling of the emitter of the transistor to the tank circuit is also chosen to maximize the Q of the oscillator, the value of a resistor connected between the emitter and a point of reference potential being chosen to reduce the phase modulation waves produced by the oscillator. The large capacitor, the coupling of the emitter to the tank circuit and the emitter resistor each contribute to the purity of, and thus reduce the noise present in the output wave of the oscillator.

This invention relates to a low noise VHF (30 mc. to 300 mc.) transistor oscillator.

It is desirable to provide a transistor oscillator producing a wave in the VHF band which has a high degree of spectral purity; that is, a transistor oscillator whose output wave is modulated only to a minimum degree by transistor noise.

It is accordingly an object of this invention to provide such a transistor oscillator.

In accordance with the invention, a tank circuit is provided having a pair of capacitor voltage dividers connected thereacross. The collector of a transistor is connected to an intermediate point of one voltage divider and the emitter of the transistor is connected to an intermediate point of the other voltage divider, the base of the transistor being connected to a terminal of the tank circuit. A voltage divider capacitor between the collector of the transistor and the connection of the tank circuit to the base of the transistor is chosen to be at least five times as great as the maximum value of the collector to base output capacity of the transistor, this output capacity varying due to variations of the current flowing between the collector and the base of the transistor while oscillating. Having chosen the first-mentioned voltage divider capacitor, a voltage divider capacitor between the emitter of the transistor and the connection of the tank circuit to the base is chosen to provide the feedback for a maximum Q of the oscillator; that is, for a minimum band width of the wave produced thereby. An adjustment of the resistance of a resistor between the emitter of the transistor and the tank circuit then provides a final adjustment for producing an output wave of minimum residual phase modulation or noise and therefore provides a still higher Q for the oscillator.

The invention will be better understood upon reading the following detailed description in connection with the drawing, the sole figure thereof being a circuit diagram of one embodiment of the invention.

In the figure, a tank circuit 10 comprising a parallel connected capacitor 12 and inductor 14 is provided. One end of the tank circuit 10 is connected to a point of reference potential such as ground 16. A capacitive voltage divider comprising two series-connected capacitors 18 and 20 is connected across the tank circuit 10, and a second capacitive voltage divider comprising two additional series-connected capacitors 22 and 24 is also connected across the tank circuit 10. A point 26 between the capacitors 18 and 20 is connected to the collector of a NPN transistor 28. A point 30 between the capacitors 22 and 24 is connected to the emitter of the transistor 28. The positive terminal 32 of a suitable source of potential (not shown) is connected to the collector of the transistor 28 through a choke coil 34. The emitter of the transistor 28 is connected to the point of reference potential 16 through a second choke coil 36 and an adjustable resistor 38 in series. The terminal 32 is also connected to the point of reference potential 16 through two resistors 40 and 42 in series. A point 44 between the resistors 40 and 42 is connected to the base of the transistor 28, this connection causing the application of a positive biasing voltage to the base of the transistor 28 with respect to ground to assist in starting the disclosed oscillator. A capacitor 46 is connected between the points 44 and 16 to bypass the resistor 42 for the oscillation frequency.

In the disclosed oscillator circuit, a variation in current flowing through the transistor 28, as when the voltage supply, not shown, is connected to the point 32, is fed back from the collector of the transistor 28 to the tuned circuit 10 by the connection from the collector to the point 26. The tuned circuit resonates at its tuned frequency and applies a voltage to the emitter of the transistor 28 due to the connection from the point 30 to the emitter. The described circuit will therefore oscillate at a frequency more or less determined by the tuned circuit 10. However, due to the variations in current flow through the transistor while oscillating, the output capacity of the transistor 28 will vary, resulting in a variation in the frequency of the oscillator. Capacitor 20, due to its connection is effectively in shunt with the output capacity of the transistor 28. The capacitor 20 is chosen to be at least five times the maximum value of the variable output capacity of the transistor 28. The frequency varying effect caused by variations in output capacity of the transistor 28 is in this manner effectively reduced or swamped out. Therefore, changes in the output capacity of the transistor 28 have very little effect on the output frequency of the oscillator. The capacity of the capacitor 24 is so chosen that the ratio of energy fed to the tank circuit 10 to the energy fed from the tank circuit 10 to the transistor 28 is such that the oscillator exhibits a maximum Q. This condition of the oscillator can be determined by adjusting the value of the capacitor 24 to the point where the band width of the output wave is a minimum. The value of the emitter resistor 38 is then chosen to reduce phase modulation of the output wave and thereby to increase the oscillator Q to an even greater value. The resultant oscillator output is then substantially free of phase modulation or deviation of its output wave, that is, of noise.

In one embodiment of the invention components having the following values were used.

| | | |
|---|---|---|
| Capacitor 12 | pf | 28 |
| Capacitor 18 | pf | 5 |
| Capacitor 20 | pf | 22 |
| Capacitor 22 | pf | 22 |
| Capacitor 24 | pf | 220 |
| Capacitor 46 | pf | 820 |
| Inductor 14 | μh | .20 |
| Inductor 34 | μh | 10 |
| Inductor 36 | μh | 10 |
| Resistor 38, maximum (variable) | ohms | 1K |
| Resistor 40 | do | 5600 |
| Resistor 42 | do | 5600 |
| Transistor type | | 2N3118 |

In the oscillator using the listed components, the frequency of the oscillator was 50 mc. and the measured noise frequency deviation was 0.2 cycle per second in a frequency slot having a band width of 4 kc., the band being 50 kilocycles displaced from the output frequency of the oscillator.

Since modifications of the invention will be evident to a person skilled in the art, the above description of the circuit and values of the components is to be considered as illustrative and not in a limiting sense.

What is claimed is:

1. A low noise oscillator comprising:
a tank circuit,
a capacitor voltage divider comprising a first and a second capacitor series connected across said tank circuit,
a transistor having an emitter, collector and base,
means for biasing said transistor for operation,
means for applying voltage variations appearing at said collector to a point on said capacitor voltage divider with said second capacitor being connected effectively in shunt with the output capacity of said transistor,
means connecting said emitter and said base to said tank circuit to cause said transistor and tank circuit to oscillate at a frequency substantially determined by said tank circuit,
the value of said second capacitor being sufficiently larger than said output capacity to reduce any frequency varying effect caused by variations in said output capacity.

2. The invention as described in claim 1 in which:
said last-mentioned means includes a second capacitive voltage divider including a third and fourth capacitor series connected across said tank circuit, with said fourth capacitor connected between said base and emitter,
the value of said fourth capacitor being chosen to maximize the Q of the oscillator.

3. The invention as described in claim 2 in which a resistor is connected between said emitter and a terminal of said second and said fourth capacitors, said resistor having a value to further decrease the noise component of the output wave of said transistor and to further increase the Q of the oscillator.

4. An oscillator comprising:
a tank circuit, a point on said tank circuit being connected to a point of reference potential,
a first and second capacitor connected in series across said tank circuit,
a transistor having an emitter, collector and a base,
a connection from a point between said first and said second capacitors to said collector,
means for coupling said emitter to said tank circuit,
a first and a second resistor connected in series between a terminal of a source of potential and said point of reference potential,
a connection from said base to the junction of said first and second resistors,
a connection from said terminal to said collector, and
a connection from said emitter to said point of reference potential through a third resistor.

5. The invention as expressed in claim 4 in which,
said coupling means comprises a third and a fourth capacitor connected in series across said tank circuit, and a connection from a point between said third and fourth capacitor to said emitter.

6. An oscillator comprising:
a tank circuit comprising a tuning inductor and a tuning capacitor connected in series, a junction of said inductor and said tuning capacitor being connected to a point of reference potential,
a first and a second capacitor connected in series across said tank circuit,
a third and a fourth capacitor also connected in series across said tank circuit,
a transistor having an emitter, collector and a base,
a connection between said first and second capacitors to said collector,
a connection between said third and fourth capacitors to said emitter,
a connection between said base and said point of reference potential,
a connection between said emitter and said point of reference potential, and
means for supplying operating potentials to said transistor.

7. The invention of claim 6 in which said second capacitor is of a value at least five times as large as the output capacity of said transistor.

8. The invention of claim 6 in which a resistor is connected in said connection between said emitter and said point of reference potential.

9. The invention of claim 6 in which said second capacitor is of a value at least five times as large as the output capacity of said transistor and in which a resistor is connected in said connection between said emitter and said point of reference potential.

10. An oscillator comprising:
a tank circuit,
a transistor having emitter, collector and base electrodes,
means for applying operating voltages to said transistor electrodes,
means for coupling said emitter, base and collector to said tank circuit to cause said transistor with said tank circuit to oscillate, the oscillations produced by said oscillator tending to vary in frequency due to changes in the output capacity of said transistor between the collector and base thereof due to changes in voltages applied between said collector and base during production of said oscillations, and
a capacitor several times as large as the maximum of said output capacity included in said coupling means and effectively connected between said collector and base for reducing said frequency variations by overwhelming said changes in said output capacity.

References Cited

UNITED STATES PATENTS 3,256,496 6/1966 Angel ............ 331—116

ROY LAKE, *Primary Examiner.*

S. H. GRIMM, *Assistant Examiner.*